United States Patent
Charley

(10) Patent No.: US 10,276,308 B2
(45) Date of Patent: *Apr. 30, 2019

(54) BST CAPACITOR CONTROL

(71) Applicant: STMicroelectronics (Tours) SAS, Tours (FR)

(72) Inventor: Sylvain Charley, Mettray (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/812,438

(22) Filed: Nov. 14, 2017

(65) Prior Publication Data

US 2018/0068800 A1 Mar. 8, 2018

Related U.S. Application Data

(63) Continuation of application No. 14/549,358, filed on Nov. 20, 2014, now Pat. No. 9,847,178.

(30) Foreign Application Priority Data

Nov. 21, 2013 (FR) ...................................... 13 61443

(51) Int. Cl.
*H01G 7/00* (2006.01)
*H03H 11/48* (2006.01)

(52) U.S. Cl.
CPC .............. *H01G 7/00* (2013.01); *H03H 11/481* (2013.01); *H03H 11/483* (2013.01)

(58) Field of Classification Search
CPC ....... H01G 7/00; H03H 11/481; H03H 11/483
See application file for complete search history.

(56) References Cited

U.S. PATENT DOCUMENTS

| | | | |
|---|---|---|---|
| 4,206,420 A | 6/1980 | Querry et al. | |
| 4,417,220 A * | 11/1983 | Holyman | H03B 5/20 327/556 |
| 4,430,630 A | 2/1984 | Sakamoto | |
| 4,644,306 A * | 2/1987 | Kleinberg | H03H 11/483 327/524 |
| 4,882,541 A | 11/1989 | Haragashira | |
| 5,146,192 A | 9/1992 | Kondo et al. | |
| 5,600,187 A * | 2/1997 | El-Hamamsy | H01G 7/00 257/296 |
| 5,973,911 A * | 10/1999 | Nishioka | H01L 28/55 257/295 |
| 6,011,440 A | 1/2000 | Bell et al. | |
| 6,025,980 A | 2/2000 | Morron et al. | |
| 6,101,102 A * | 8/2000 | Brand | H02M 1/12 257/E27.049 |
| 6,275,178 B1 * | 8/2001 | Koifman | G11C 27/024 257/312 |
| 6,577,114 B1 | 6/2003 | Roo | |
| 7,005,936 B2 | 2/2006 | Tanzawa | |

(Continued)

OTHER PUBLICATIONS

LM359 Dual, High Speed, Programmable, Current Mode (Norton) Amplifiers, 2013, Texas Instruments, p. 27.*

(Continued)

*Primary Examiner* — Thomas J. Hiltunen
(74) *Attorney, Agent, or Firm* — Seed IP Law Group LLP

(57) ABSTRACT

A circuit for controlling a capacitor having a capacitance adjustable by biasing, including an amplifier for delivering a D.C. bias voltage, having a feedback slowed down by a resistive and capacitive cell.

16 Claims, 3 Drawing Sheets

(56) References Cited

U.S. PATENT DOCUMENTS

| | | | |
|---|---|---|---|
| 7,248,108 B2 | 7/2007 | Fratti | |
| 7,714,676 B2* | 5/2010 | McKinzie, III | H03H 7/38 |
| | | | 333/17.3 |
| 8,493,114 B2 | 7/2013 | Cho et al. | |
| 8,670,639 B2* | 3/2014 | Yoshida | H04Q 11/0005 |
| | | | 359/344 |
| 9,293,939 B2* | 3/2016 | Moindron | H02J 7/0072 |
| 9,847,178 B2* | 12/2017 | Charley | H01G 7/00 |
| 9,859,843 B2* | 1/2018 | Charley | H03B 5/20 |
| 9,899,153 B2* | 2/2018 | Charley | G01R 15/165 |
| 10,103,705 B2* | 10/2018 | Charley | H01G 7/06 |
| 2008/0136545 A1* | 6/2008 | Fayneh | H03B 5/20 |
| | | | 331/36 C |
| 2008/0139160 A1* | 6/2008 | Tan | H03H 11/0444 |
| | | | 455/323 |
| 2009/0153431 A1 | 6/2009 | Ni | |
| 2013/0201599 A1* | 8/2013 | Kumada | H03J 3/20 |
| | | | 361/278 |
| 2015/0243437 A1 | 8/2015 | Charley et al. | |
| 2016/0372266 A1 | 12/2016 | Charley | |

OTHER PUBLICATIONS

Jim Karki, Texas Instruments, Application Report, SLOA047—Mar. 2001, "Using a Decompensated Operational Amplifier for Improved Performance," 14 pages.

Ken Kavanagh, "Boost Supply and High-Voltage DAC Provide Tuning Signal for Antennas and Filters," Analog Dialogue 44-12 Back Burner, Dec. 2010, 3 pages.

Robert Pease, EDN Network, "Improved unity-gain follower delivers fast, stable response," Jun. 27, 2011, 4 pages.

* cited by examiner

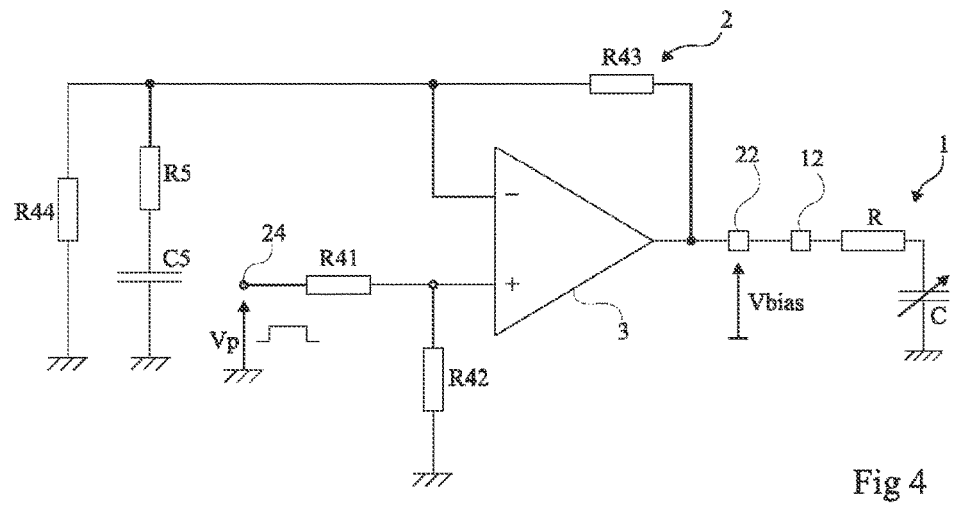
Fig 4
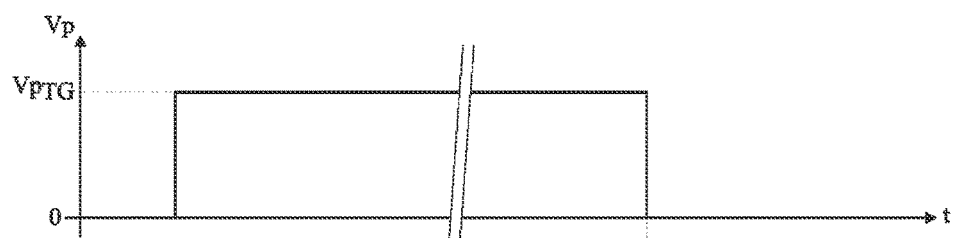
Fig 5A
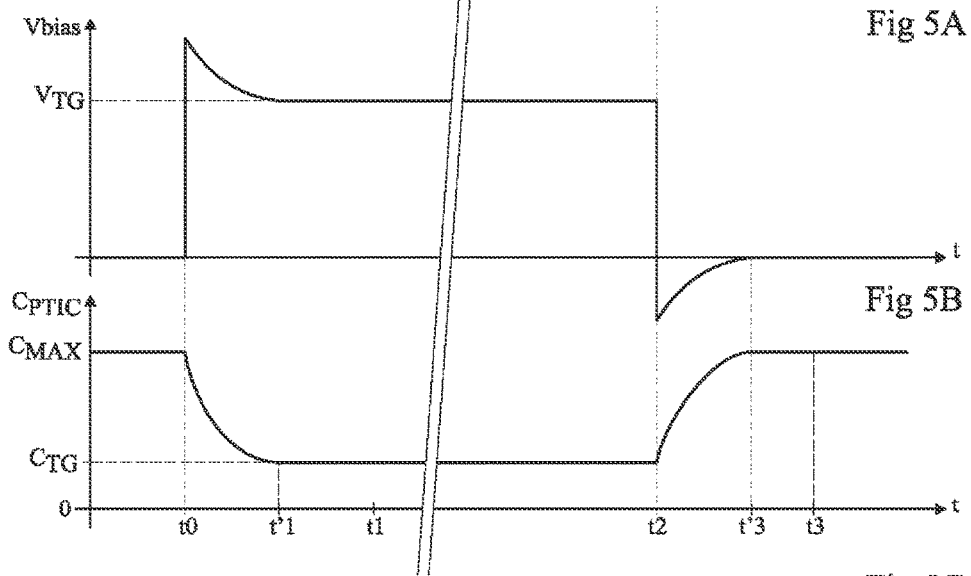
Fig 5B
Fig 5C

BST CAPACITOR CONTROL

BACKGROUND

Technical Field

The present disclosure generally relates to electronic circuits and, more specifically, to the control of capacitors having a value adjustable by application of a bias voltage. The present disclosure more specifically applies to the control of BST (Barium-Strontium-Titanium) capacitors.

Description of the Related Art

BST capacitors have been developed for radio-frequency applications, in particular for mobile telephony. Having a capacitor with an analogically-adjustable capacitance significantly improves performances, since it enables to adapt the device comprising such a capacitor to the outer environment.

A BST capacitor appears in the form of an integrated circuit (this type of capacitor is also called adjustable integrated capacitor). The capacitance of a BST capacitor is set by the value of a D.C. bias potential which is applied thereto, generally in a range from a few volts to a few tens of volts, typically between 2 and 20 volts.

The bias voltage of a BST capacitor is generally provided by a dedicated control circuit, performing a high-voltage digital-to-analog conversion, that is, converting a digital configuration word (generally, a byte) into a D.C. analog voltage to be applied to the capacitor to set its capacitance.

BRIEF SUMMARY

An embodiment is directed to providing an output stage of a control circuit for an adjustable capacitor which overcomes all or part of the disadvantages of usual output stages.

Another embodiment is directed to allowing a fast switching of the capacitance value of the capacitor.

Another embodiment is directed to a parameterizable solution to adapt the control circuit according to the capacitor type.

Thus, an embodiment provides a circuit for controlling a capacitor having a capacitance adjustable by biasing, comprising an amplifier for delivering a D.C. bias voltage, having a feedback slowed down by a resistive and capacitive cell.

According to an embodiment, the resistive and capacitive cell is sized according to a time constant of the capacitor of adjustable capacitance.

According to an embodiment:

a first terminal of the amplifier receives a voltage depending on the value selected for the capacitance of the adjustable capacitor and conditioning the value of a voltage for biasing the capacitor of adjustable capacitance; and a second terminal of the amplifier is connected, via a resistive element, to its output terminal and, via the resistive and capacitive cell, to ground.

According to an embodiment, the resistive and capacitive cell comprises a network of switchable capacitances.

An embodiment also provides a system comprising:

at least one capacitor having an adjustable capacitance; and at least one control circuit.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

FIG. 4 shows an embodiment of an output stage of an adjustable capacitor control circuit;

FIGS. 5A, 5B, and 5C illustrate, in the form of timing diagrams, the operation of the circuit of FIG. 4;

DETAILED DESCRIPTION

Figure 1:
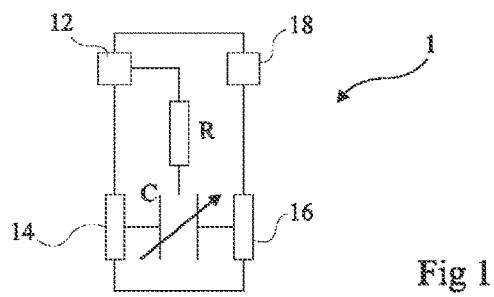
FIG. 1 is a simplified representation of a BST capacitor.

The same elements have been designated with the same reference numerals in the different drawings. For clarity, only those steps and elements which are useful to the understanding of the embodiments which will be described have been shown and will be detailed. In particular, the forming of a BST capacitor as well as of the other portions of the control circuit have not been detailed, the described embodiments being compatible with usual applications of capacitors adjustable by application of a bias voltage (for example, BST capacitors) and of the rest of the control circuit. Further, the different possible applications of a BST capacitor have not been detailed either, the described embodiments being here again compatible with usual applications. In the following description, expressions approximately, about, and in the order of mean to within 10%.

FIG. 1 is a simplified representation of an integrated circuit 1 forming a BST capacitor. This circuit generally comprises at least three terminals 12, 14, and 16. In practice, for industrial manufacturing reasons, the integrated circuit package may comprise other terminals 18 which are not intended to be connected. Terminals 14 and 16 define terminals corresponding to the electrodes of capacitor C intended to be connected to the radio frequency application. Further, one of terminals 14 and 16 is grounded. According to the application, such a connection is either direct, or (case of a capacitor used in series in the radio frequency chain) via an inductive element. Terminal 12 defines a terminal of application of a bias voltage Vbias setting the value of the capacitance of capacitor C. From an electrical point of view, this bias potential is applied via a resistor R.

Figure 2:
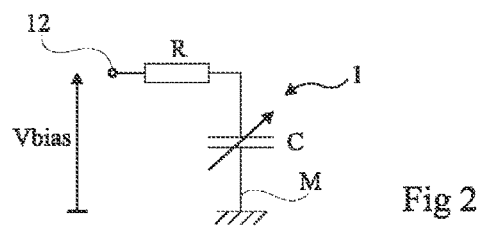
FIG. 2 is an equivalent electric diagram of a capacitor having a capacitance adjustable by biasing.

FIG. 2 shows the equivalent electric diagram of BST capacitor 1. The resistor of application of bias voltage Vbias forms, with capacitor C, a series RC circuit between terminal 12 of application of voltage Vbias and ground M.

Figure 3A:
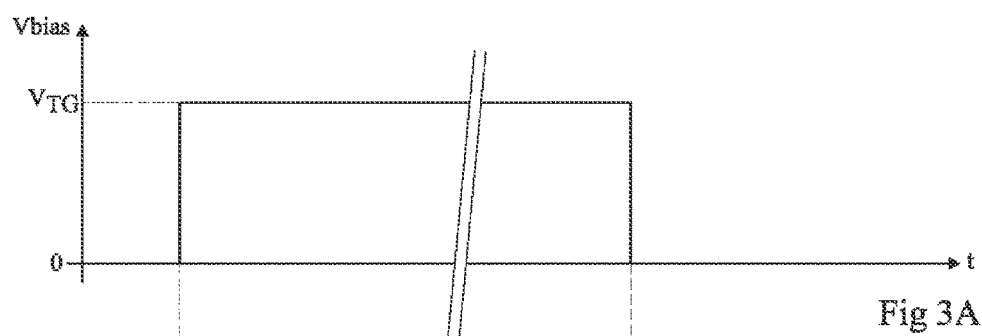
FIGS. 3A and 3B illustrate an example of setting of the capacitance of a BST capacitor by means of its bias signal.
Figure 3B:
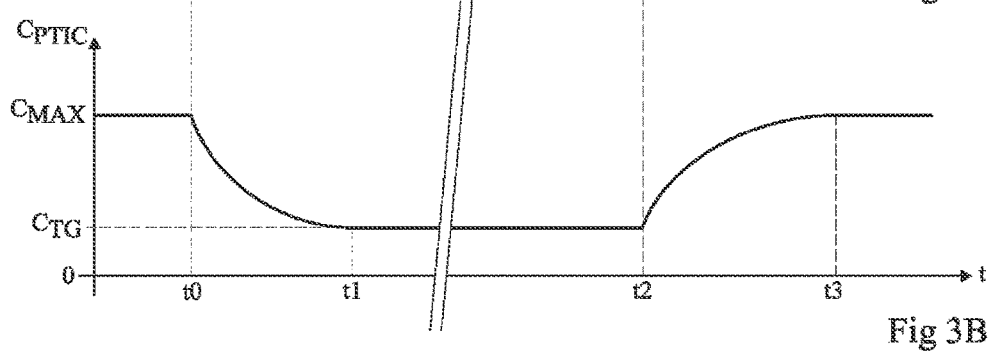

FIGS. 3A and 3B are timing diagrams illustrating the setting of the capacitance value of capacitor C. FIG. 3A illustrates an example of the shape of signal Vbias applied to terminal 12. FIG. 3B illustrates the corresponding variation of capacitance $C_{PTIC}$ of capacitor C.

In the quiescent state, voltage Vbias is zero and capacitance $C_{PTIC}$ has a maximum value $C_{MAX}$. At a time t0, the external control circuit applies a voltage $V_{TG}$ conditioning target value $C_{TG}$ of capacitance $C_{PTIC}$. In practice, the control circuit formed of a digital-to-analog converter contains a correlation table between a digital instruction word provided by the application and a corresponding potential to be applied to terminal 12 to reach target value $C_{TG}$. The application of potential $V_{TG}$ at time t0 translates as a decrease of capacitance $C_{PTIC}$ until the target value is reached at a time t1. The interval between times t0 and t1 depends on the time constant of the RC cell formed by the BST capacitor.

Such a time constant is typically a plurality of tens of microseconds, in the range from 20 to 40 microseconds, and is linked to the very structure of the BST capacitor. With a time constant in the order of 30 microseconds, the application of a bias signal Vbias such as illustrated in FIG. 3A results, in practice, in an interval between times t0 and t1 capable of reaching some hundred microseconds. It would be desirable to decrease this time interval. Indeed, the time interval between time t0 of application of the bias signal and time t1, where the BST capacitor reaches the desired value, conditions the time for the application to be functional.

The same phenomenon occurs when the value of the capacitor changes by modification of the level of voltage Vbias or when capacitor 1 is no longer used by the application, for example after a switching to stand-by. For a change of value (not shown), signal Vbias is switched to a different target value $V_{TG}$, which generates a different capacitance $C_{PTIC}$. To stop the capacitor, the control circuit cancels voltage Vbias (time t2) and capacitance $C_{PTIC}$ then recovers its maximum quiescent value at a time t3. Here again, the interval between times t2 and t3 depends on the time constant of cell RC formed by the capacitor.

It could have been devised to cause, at time t0 or at time t3, an overvoltage at a level exceeding target level $V_{TG}$ to accelerate the capacitor biasing, by varying the input digital reference of the control circuit. This may however result, when the capacitance value changes, in too long overvoltages, which risk exceeding a variation range authorized by the application around desired capacitance values. This further uses an accurate and frequent control of the digital reference, implying many exchanges between the control circuit and the circuit providing it with the digital reference.

FIG. 4 is an electric diagram of an embodiment of an output stage of a control circuit 2 (the rest of which is not shown in FIG. 2). This output stage provides, on an output terminal 22 of the control circuit, bias signal Vbias. Terminal 22 is thus, in the application, connected to terminal 12 of integrated circuit 1, symbolized in FIG. 4 by the equivalent RC cell.

The output stage is formed of a high-voltage amplifier 3 (as compared with a low power supply voltage of the digital circuits), having a first input (for example, non-inverting (+)) receiving, via a resistor R41, a control voltage Vp resulting from the digital-to-analog conversion of the reference word. A resistor R42 further grounds the non-inverting terminal. The output of amplifier 3 is looped back on its input, for example, its inverting input (−), by a resistor R43. Further, this inverting input is grounded, by a series RC cell formed of a resistor R5 in series with a capacitive element C5, an additional resistor R44 being optionally connected in parallel on cell R5C5.

The function of cell R5C5 is to slow down the feedback at the level of amplifier 3. Thus, a voltage peak (positive or negative according to the variation direction of voltage Vp) which damps within a time depending on the time constant set by cell R5C5.

By selecting the values of components R5 and C5 so that time constant R5C5 approximately corresponds to time constant RC of capacitor 1, the time interval between the times at which the bias voltage is applied and at which the target capacitance value is reached is decreased.

Advantage is here taken from the fact that time constant RC of capacitor 1 (FIG. 2) is approximately the same for a given type of BST capacitor. Accordingly, the values of resistance R5 and of capacitor C5 can be set according to this value.

FIGS. 5A, 5B, and 5C illustrate the operation of the circuit of FIG. 4. FIG. 5A shows an example of the shape of signal Vp provided by the digital-to-analog conversion of the control circuit on input terminal 24 of output stage 2. FIG. 5B illustrates the corresponding shape of output voltage Vbias. FIG. 5C illustrates the corresponding shape of capacitance $C_{PTIC}$ of the BST capacitor.

It is assumed that at a time t0, signal Vp switches from a zero value to a value VpTG which is a function of target value $V_{TG}$ to be reached at the level of signal Vbias. Voltage Vp is a low voltage with respect to voltage Vbias, that is, it varies within the power supply range of the digital circuits of the control circuit, typically of a few volts, or even less (for example, in the order of 1.8 volt). Voltage Vbias is a relatively high voltage, in that it takes values used for the programming of the BST capacitor, which may reach a plurality of tens of volts. The power supply voltage of amplifier 3 is selected according to the maximum voltage used for the programming of capacitor 1, for example, in the order of some twenty volts.

In a way, cell R5C5 deceives amplifier 3 by delaying the growth of the potential of its negative feedback terminal with respect to the increase of the level of its output terminal 22. This thus causes an overvoltage at time t0, which damps until a time t'1 at which voltage Vbias falls back to level $V_{TG}$ in stable fashion. As for capacitance $C_{PTIC}$, its value falls from value $C_{MAX}$ to value $C_{TG}$ between times t0 and t'1.

Due to the sizing of cell R5C5, the interval between times t0 and t'1 can approximately correspond to the time constant of the RC cell of capacitor 1. Such is in particular the case if cell R5C5 is properly sized in relation to the time constant of capacitor 1.

At a time t2 when capacitance $C_{PTIC}$ is desired to return to its quiescent level, signal Vp is canceled. There then is a negative voltage peak at this time t2 and this peak damps until a time t'3 when capacitance $C_{PTIC}$ recovers value $C_{MAX}$.

For a change of value (not shown) of capacitance $C_{PTIC}$, a similar operation occurs with a positive or negative voltage peak according to whether value $C_{PTIC}$ is decreased or increased.

As appears in FIG. 5C, times t'1 and t'3 come before times t1 and t3 of the normal operation.

Figure 6:
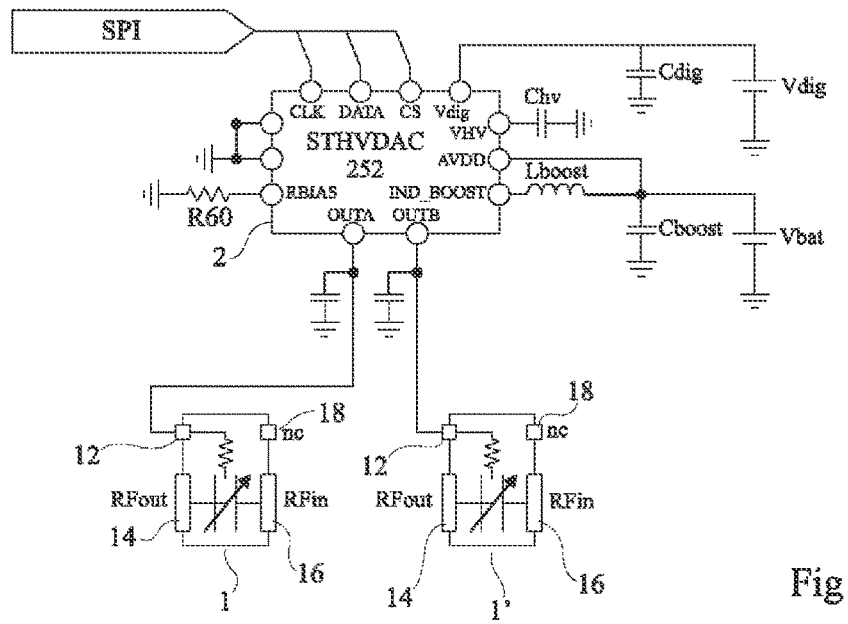
FIG. 6 is a simplified representation of a control circuit associated with BST capacitors.

FIG. 6 is a simplified representation of a control circuit 2 in the form of an integrated high-voltage digital-to-analog converter. Two voltages, respectively a digital power supply voltage Vdig (for example, 1.8 volts), and an analog power supply voltage Vbat (for example, 3.6 volts), are applied to terminals Vdig and Avdd of circuit 2. A filtering element Cdig may be connected between terminal Vdig and the ground. The digital reference (data word) originates from other circuits, not shown, of the application and is, in this example, provided by a serial bus SPI of three conductors CLK, Data, and CS of circuit 2. A terminal IND_BOOST receives voltage Vbat via an inductive element Lboost and a capacitor Cboost is connected in parallel on voltage Vbat. This assembly has the function of powering a voltage step-up stage generating the voltage used to control capacitors 1 and 1'. This high voltage is applied to terminal VHV, to power a voltage step-up stage generating the power supply used to control the capacitor. A resistor R60 grounds a terminal Rbias and a capacitor Chv grounds a terminal VHV (receiving the high voltage generated by the step-up stage). Such usual elements form elements for biasing circuit 2. Other terminals of this circuit are capable of being further grounded. The representation of FIG. 6 is an arbitrary example and other control circuits may apply to the described embodiments.

In this example, circuit 2 comprises two output terminals OUTA and OUTB intended to control two BST capacitors 1 and 1' of the previously-described type. In this example, it can be considered that terminal 16 of each capacitor 1, 1' forms an input terminal RFin for the radio signal while terminal 14 forms an output terminal RFout for this signal. However, a capacitor 1 is symmetrical and the connection of these terminals depends on the application.

Figure 7:
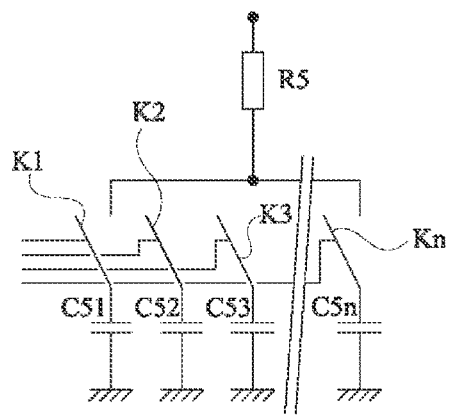
FIG. 7 shows an alternative embodiment of an RC cell of the output stage of FIG. 4.

FIG. 7 illustrates an alternative embodiment of cell R5C5 of FIG. 4, according to which capacitor C5 is formed of a network of switchable capacitors C51, C52, C53, . . . , C5n, each connected, for example, in series, with a switch K1, K2, K3, Kn connecting it to resistor R5. Switches K1 to Kn are controlled by the digital portion of circuit 2 to set the capacitance value of capacitor C5. Such a variation enables to adapt control circuit 2 and more specifically its output stage to different types of BST capacitors having different nominal time constants.

According to another variation, not shown, which may be combined with the former, switchable resistors R5 may be used.

Figure 8:
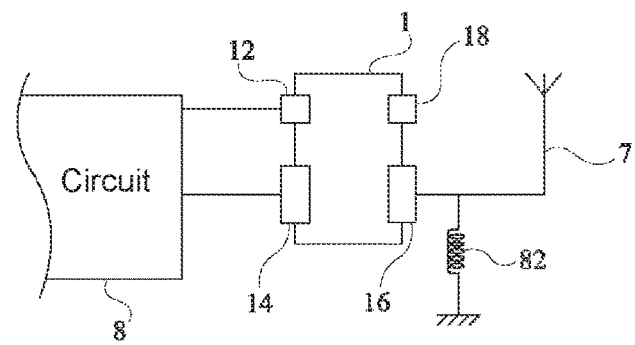
FIG. 8 is an example of application of a BST capacitor.

FIG. 8 illustrates an example of application of a BST capacitor 1. In this example, it is assumed that capacitor 1 takes part in the tuning of an antenna 7 intended to receive radio signals from a circuit 8 which has not been detailed. The capacitor being series-connected in the application, an inductive element 82 grounds one of terminals 14 and 16 (here, terminal 16).

Multiple applications use capacitors adjustable by continuous biasing, among which, as an example, adjustable antenna matching networks in multiband mobile telephony systems, tunable radio filters, frequency band adjustment circuits, voltage standing wave ratio (VSWR) correction circuits, etc.

Various embodiments and variations have been described. Various alterations, modifications, and improvements will occur to those skilled in the art. In particular, the selection of the values to be given to the components of the output stage of the control circuit, and particularly to resistances R5 and C5, depends on the application and more specifically on the BST capacitors for which this output stage is intended. Such a sizing is within the abilities of those skilled in the art based on the functional indications given hereabove. As a specific embodiment, resistances R41, R42, R43, and R44 are resistances on the order of one megaohm. For a BST capacitor having a time constant in the order of 30 microseconds, resistance R5 may take a value in the order of 1 MΩ and capacitor C5 may take a value in the order of 30 pF.

Further, the practical implementation of the described embodiments is within the abilities of those skilled in the art based on the functional indications given hereabove.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
    applying an input voltage to a first input terminal of an amplifier, a second input terminal of the amplifier being coupled to a first resistor, a first capacitor being coupled between the first resistor and ground;
    outputting, in response to applying the input voltage to the first input terminal, a bias voltage from an output terminal of the amplifier to an adjustable capacitor;
    changing the bias voltage from a first voltage level to a second voltage level;
    changing the bias voltage from the second voltage level to a third voltage level; and
    changing a capacitance of the adjustable capacitor from a first capacitance level to a second capacitance level in a first time interval, the bias voltage changing from the second voltage level to the third voltage level in a second time interval that is approximately equal to the first time interval.

2. The method of claim 1 wherein a second resistor is coupled between the output terminal of the amplifier and the second input terminal of the amplifier.

3. The method of claim 1 wherein a second resistor is coupled between the second input terminal of the amplifier and ground.

4. The method of claim 1 wherein a second resistor is coupled to the first input terminal, a third resistor is coupled between the first input terminal and ground, and the input voltage is applied to the second resistor.

5. The method of claim 1 wherein the adjustable capacitor is a barium strontium titanium (B S T) capacitor.

6. A method, comprising:
    applying an input voltage to a first input terminal of an amplifier, a second input terminal of the amplifier being coupled to a resistive and capacitive cell;
    slowing, by the resistive and capacitive cell, a feedback of the amplifier;
    generating, by the amplifier, a bias voltage; and
    delivering, by the amplifier, the bias voltage to an adjustable capacitor.

7. The method of claim 6 wherein the resistive and capacitive cell includes a first resistor coupled to the second input terminal of the amplifier, and a first capacitor coupled to the first resistor and ground.

8. The method of claim 7 wherein a second resistor is coupled between the output terminal of the amplifier and the second input terminal of the amplifier.

9. The method of claim 6 wherein a first resistor is coupled to the first input terminal, a second resistor is coupled between the first input terminal and ground, and the input voltage is applied to the first resistor.

10. The method of claim 6 wherein the resistive and capacitive cell is sized according to a time constant of the adjustable capacitor.

11. The method of claim 6 wherein the adjustable capacitor is a barium strontium titanium (BST) capacitor.

12. A method, comprising:
  applying an input voltage to a first input terminal of an amplifier, a second input terminal of the amplifier being coupled to a resistive and capacitive cell having a first time constant;
  outputting, in response to applying the input voltage to the first input terminal, a bias voltage from an output terminal of the amplifier to an adjustable capacitor; and
  changing a capacitance of the adjustable capacitor from a first capacitance level to a second capacitance level in a first time interval, the first time interval approximately corresponding to the first time constant.

13. The method of claim 12 wherein the resistive and capacitive cell includes a first resistor coupled to the second input terminal of the amplifier, and a first capacitor coupled to the first resistor and ground.

14. The method of claim 13 wherein a second resistor is coupled between the output terminal of the amplifier and the second input terminal of the amplifier.

15. The method of claim 12 wherein a first resistor is coupled to the first input terminal, a second resistor is coupled between the first input terminal and ground, and the input voltage is applied to the first resistor.

16. The method of claim 12 wherein the adjustable capacitor is a barium strontium titanium (BST) capacitor.

\* \* \* \* \*